United States Patent
Lee et al.

(10) Patent No.: US 12,535,167 B2
(45) Date of Patent: Jan. 27, 2026

(54) PIPELINE CONNECTING MODULE AND LIQUID COOLING SYSTEM

(71) Applicant: Wiwynn Corporation, New Taipei (TW)

(72) Inventors: Kun-Hsien Lee, New Taipei (TW); Lai-Wang Cai, New Taipei (TW); Chien-Yao Peng, New Taipei (TW); Wei-Chen Lin, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 20 days.

(21) Appl. No.: 18/749,636

(22) Filed: Jun. 21, 2024

(65) Prior Publication Data
US 2025/0389361 A1    Dec. 25, 2025

(30) Foreign Application Priority Data
Sep. 7, 2023   (TW) ................. 112133965

(51) Int. Cl.
*F16L 37/52* (2006.01)
*F16L 19/02* (2006.01)
*H05K 7/20* (2006.01)

(52) U.S. Cl.
CPC .......... *F16L 37/52* (2013.01); *F16L 19/0206* (2013.01); *F16L 19/0212* (2013.01); *H05K 7/20272* (2013.01); *H05K 7/20772* (2013.01)

(58) Field of Classification Search
CPC ......... F16L 27/02; F16L 27/10; F16L 27/026; F16L 27/08; F16L 37/52; F16L 37/50; H05K 7/20781; H05K 7/20818; H05K 7/20772; H05K 7/20272
See application file for complete search history.

(56) References Cited

U.S. PATENT DOCUMENTS

| | | | | |
|---|---|---|---|---|
| 7,464,967 | B2 * | 12/2008 | Mieger | B60D 1/62 37/468 |
| 2020/0041057 | A1 * | 2/2020 | Rapien | F16L 37/50 |
| 2022/0381387 | A1 * | 12/2022 | Fysikopoulos | F16L 37/50 |
| 2023/0050005 | A1 * | 2/2023 | Yang | H05K 7/20772 |
| 2024/0175528 | A1 * | 5/2024 | Peng | F16L 27/026 |
| 2024/0328556 | A1 * | 10/2024 | Peng | F16L 37/50 |
| 2024/0414872 | A1 * | 12/2024 | Wu | H05K 7/20772 |
| 2024/0414891 | A1 * | 12/2024 | Wu | F16L 27/026 |

FOREIGN PATENT DOCUMENTS

| | | |
|---|---|---|
| CN | 106958702 A | 7/2017 |
| CN | 215445497 U | 1/2022 |
| CN | 114449835 A | 5/2022 |

\* cited by examiner

*Primary Examiner* — David Bochna
(74) *Attorney, Agent, or Firm* — Winston Hsu (57) ABSTRACT

A pipeline connecting module includes a base, a floating component, a plurality of elastic components and a pipeline connecting component. The base has an accommodating hole. The floating component is floatingly disposed in the accommodating hole. The plurality of elastic components are disposed at a periphery of the floating component and abut against the base. The pipeline connecting component passes through the floating component.

18 Claims, 9 Drawing Sheets

PIPELINE CONNECTING MODULE AND LIQUID COOLING SYSTEM

BACKGROUND OF THE INVENTION

1. Field of the Invention

The invention relates to a pipeline connecting module and, more particularly, to a pipeline connecting module capable of absorbing assembly and/or manufacturing tolerances during assembly and a liquid cooling system equipped with the pipeline connecting module.

2. Description of the Prior Art

As the speed and performance of an electronic component (e.g. central processing unit) in a server increase, more and more servers use a liquid cooling manner to dissipate heat from the electronic component to improve heat dissipating efficiency. When the server is installed in a rack, a pipeline connecting module on the server and a pipeline bracket in the rack are connected with blind connectors to exchange coolant. However, the assembly and/or manufacturing tolerances of the pipeline connecting module and the pipeline bracket may easily cause the connectors to fail to be assembled or even cause damage to the connectors.

SUMMARY OF THE INVENTION

According to an embodiment of the invention, a pipeline connecting module comprises a base, a floating component, a plurality of elastic components and a pipeline connecting component. The base has an accommodating hole. The floating component is floatingly disposed in the accommodating hole. The plurality of elastic components are disposed at a periphery of the floating component and abut against the base. The pipeline connecting component passes through the floating component.

According to another embodiment of the invention, a liquid cooling system comprises a rack, a pipeline bracket, an electronic device and a pipeline connecting module. The pipeline bracket is disposed in the rack. The pipeline bracket has a manifold socket. The electronic device is disposed in the rack. The pipeline connecting module is disposed on the electronic device. The pipeline connecting module comprises a base, a floating component, a plurality of elastic components and a pipeline connecting component. The base has an accommodating hole. The floating component is floatingly disposed in the accommodating hole. The plurality of elastic components are disposed at a periphery of the floating component and abut against the base. The pipeline connecting component passes through the floating component. The pipeline connecting component is connected to the manifold socket.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
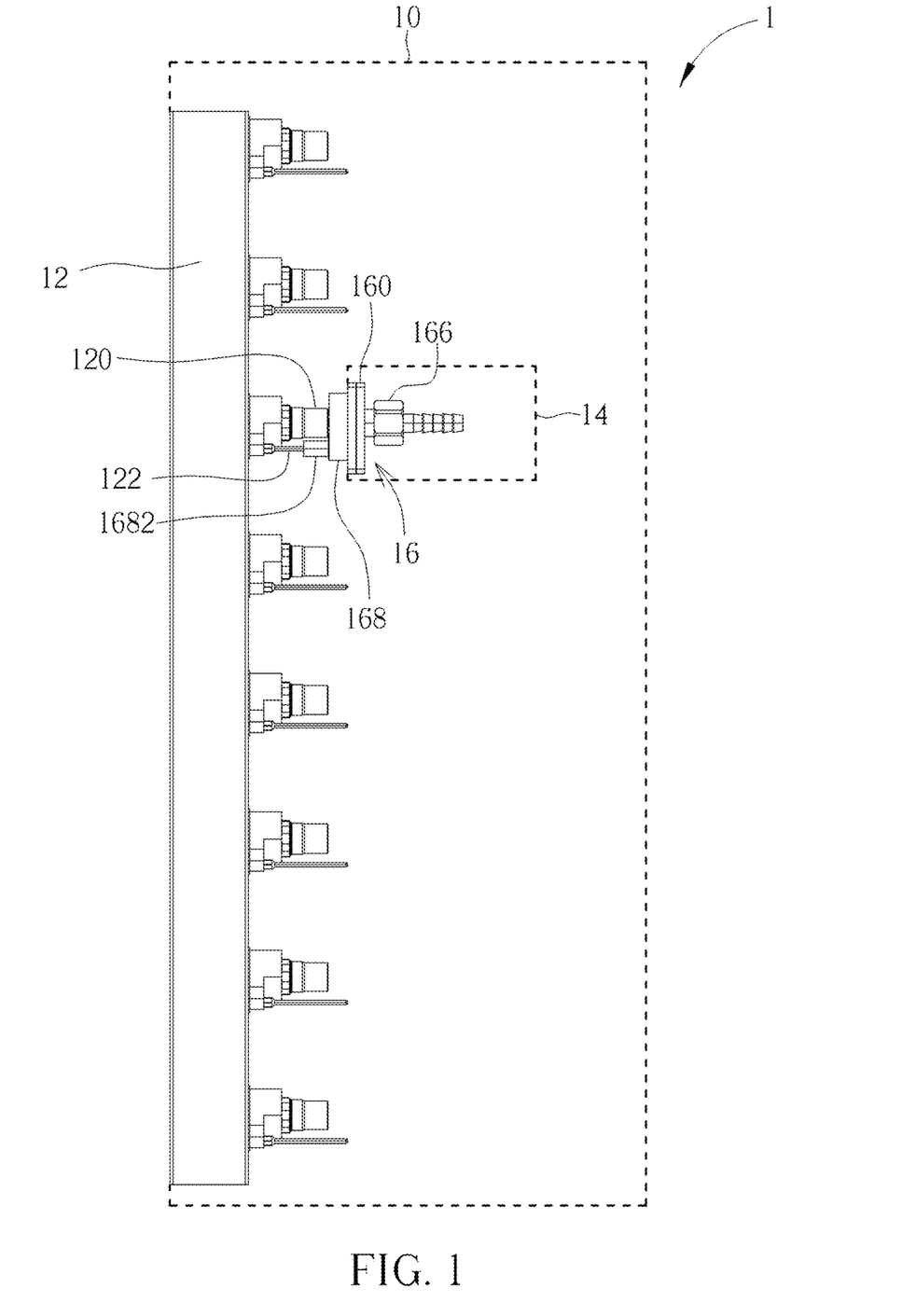
FIG. 1 is a schematic view illustrating a liquid cooling system according to an embodiment of the invention.
Figure 2:
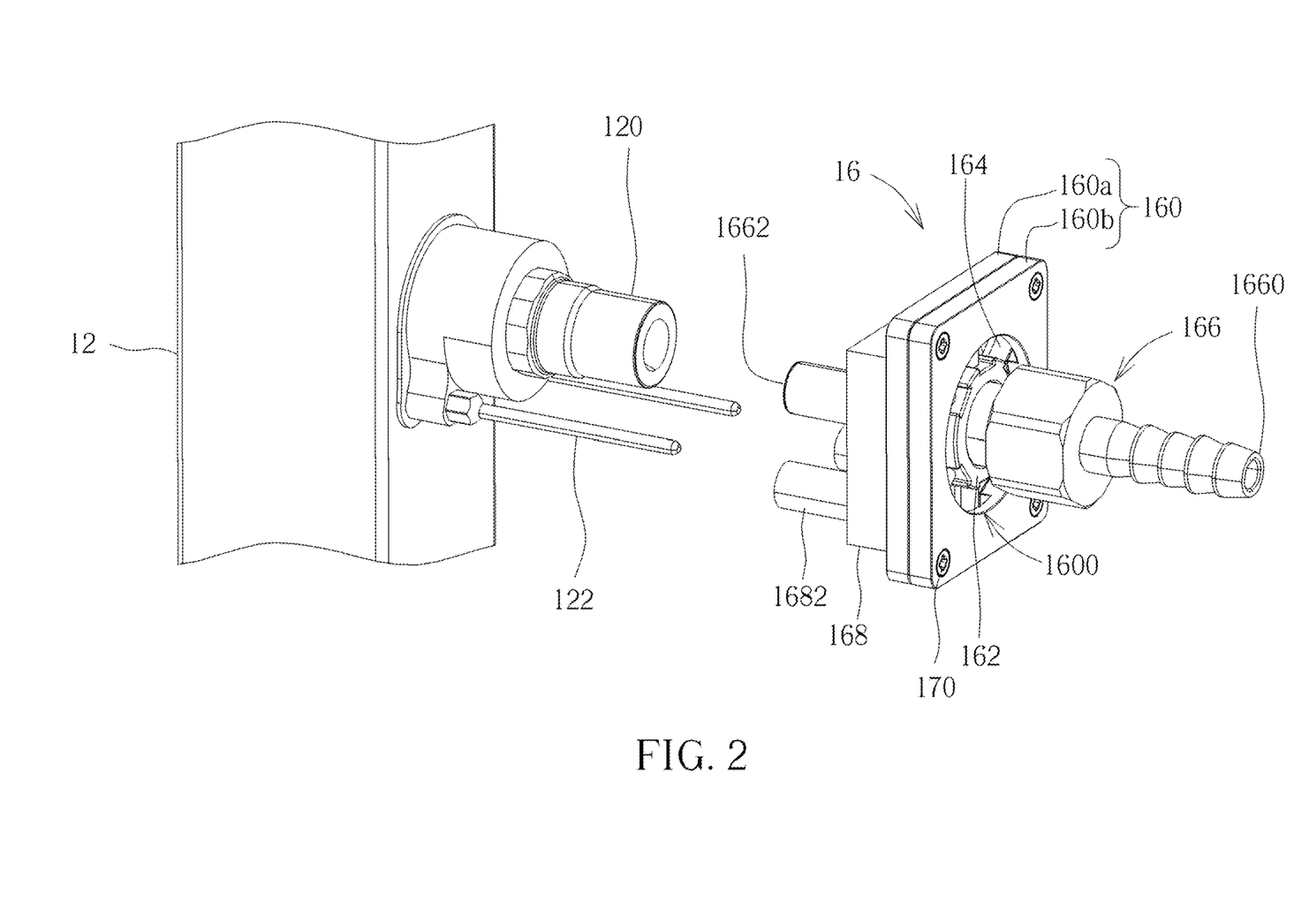
FIG. 2 is a partial exploded view illustrating a pipeline bracket and a pipeline connecting module shown in FIG. 1.
Figure 3:
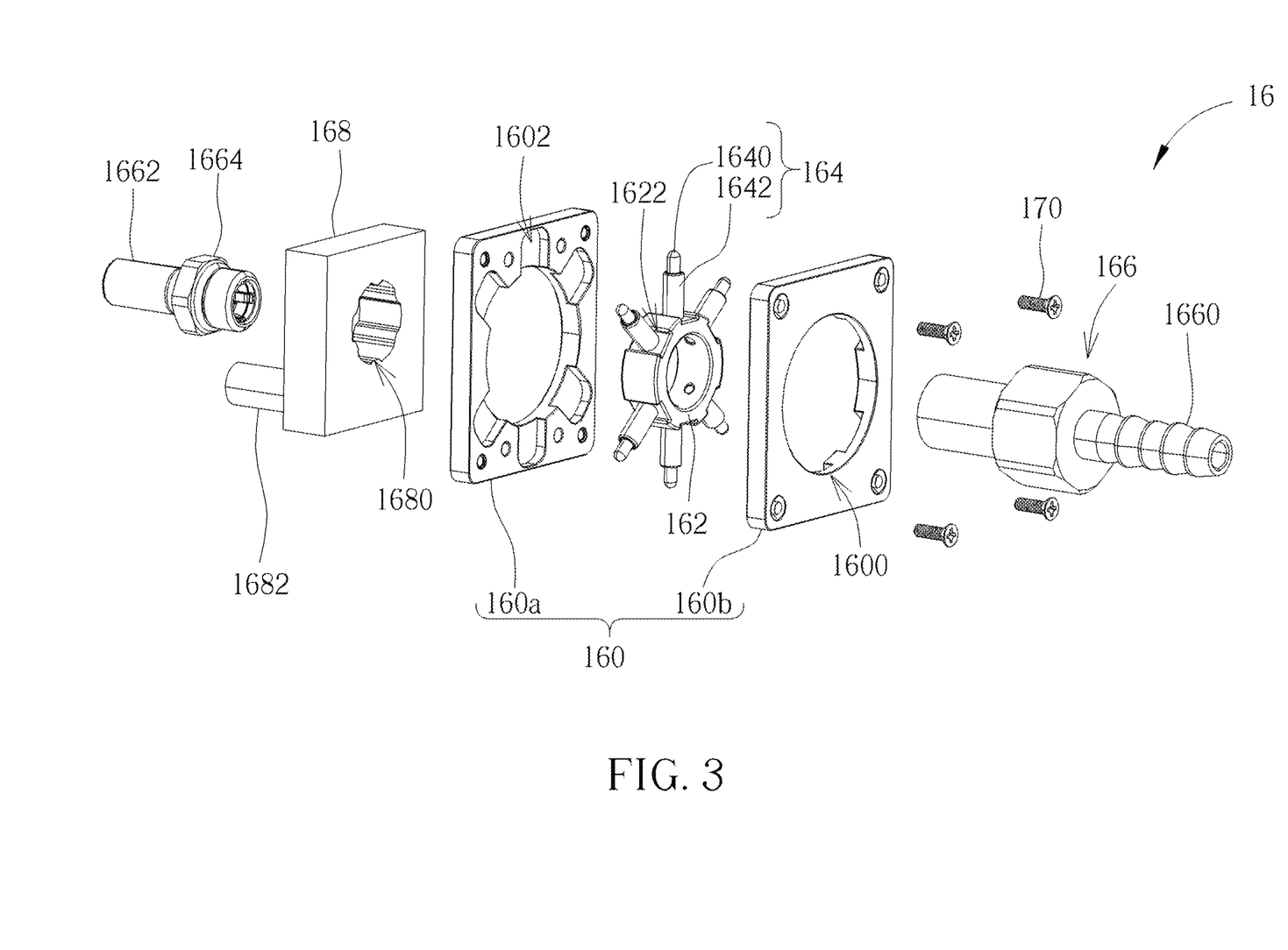
FIG. 3 is an exploded view illustrating the pipeline connecting module shown in FIG. 2.
Figure 4:
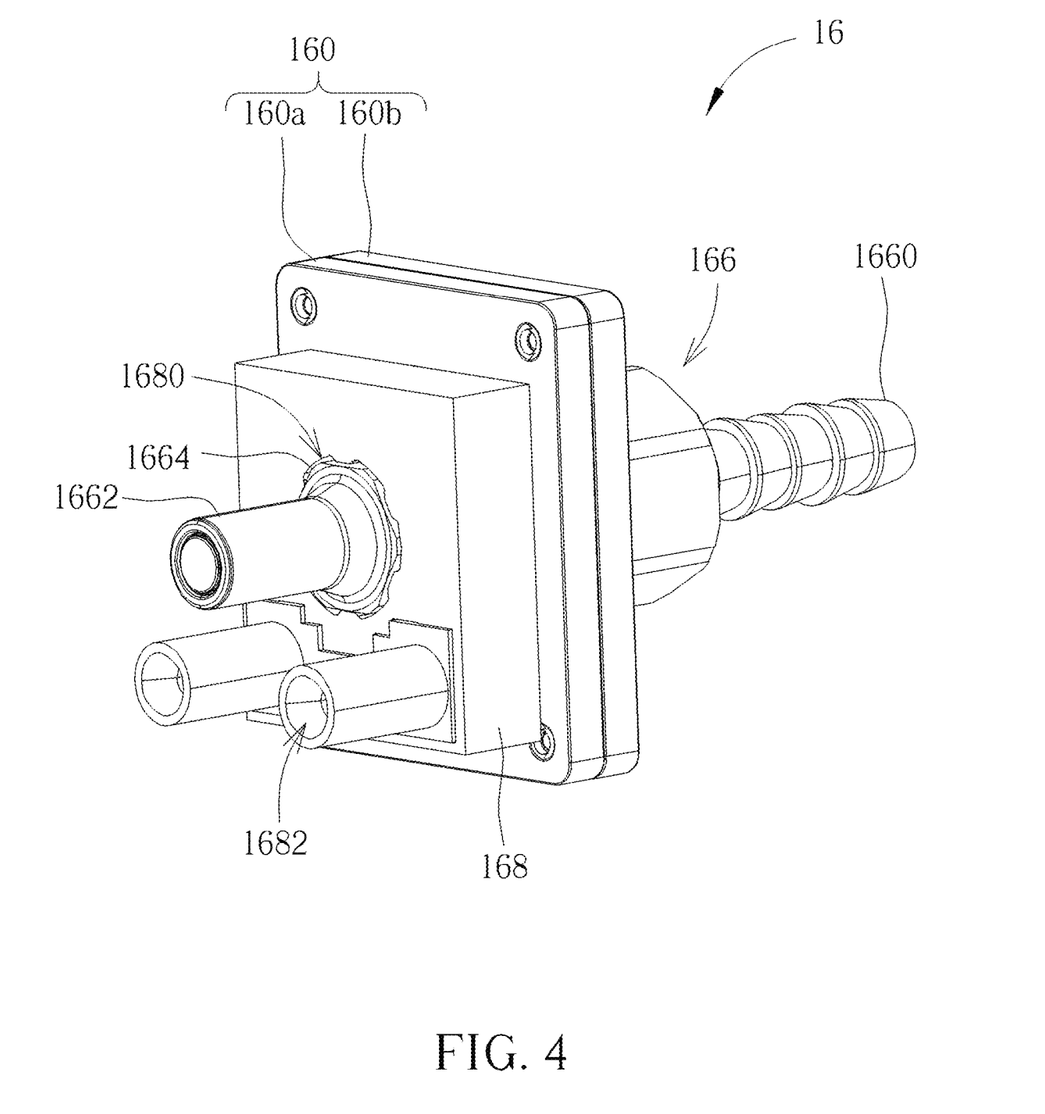
FIG. 4 is a perspective view illustrating the pipeline connecting module shown in FIG. 2 from another viewing angle.
Figure 5:
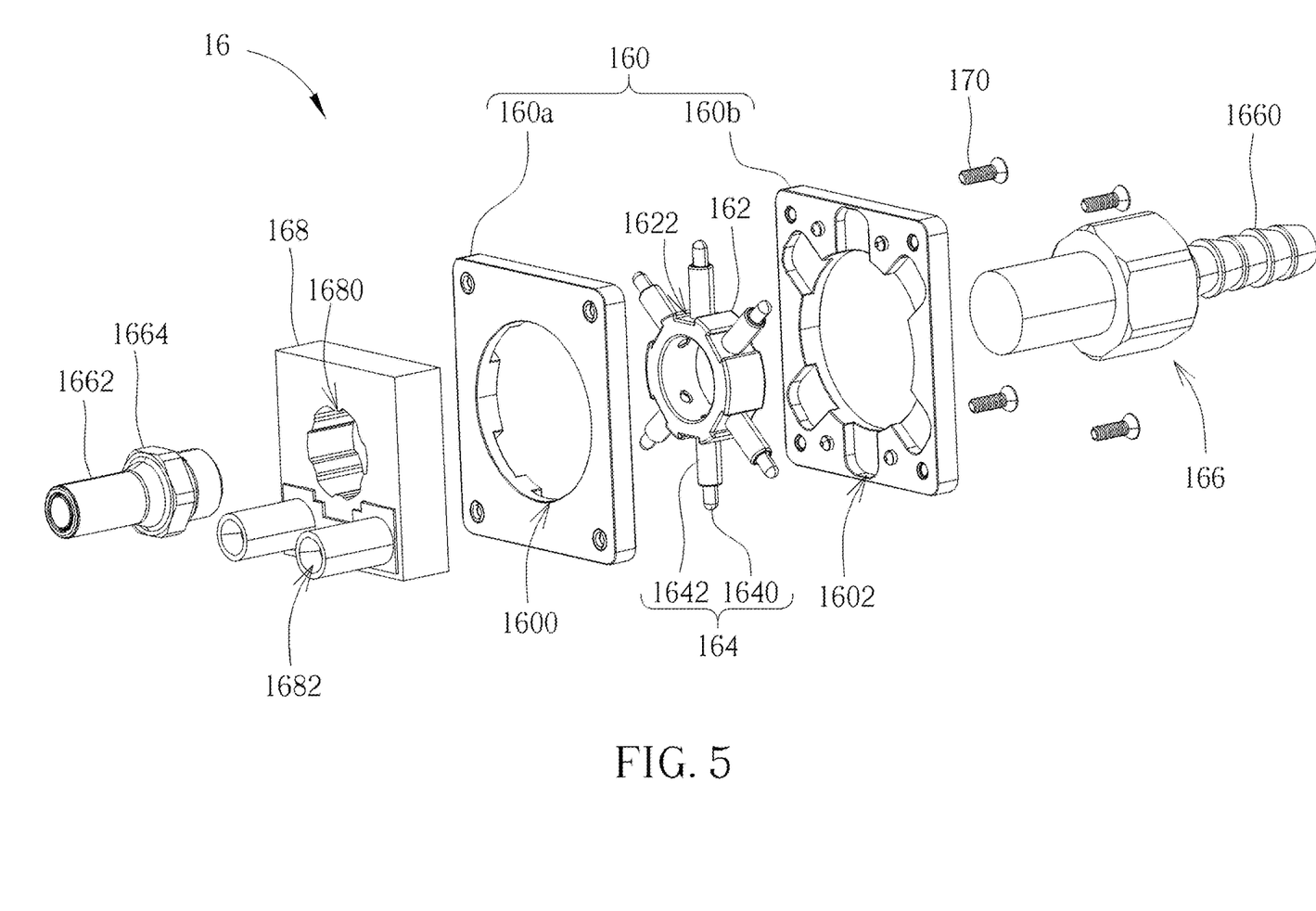
FIG. 5 is an exploded view illustrating the pipeline connecting module shown in FIG. 4.
Figure 6:
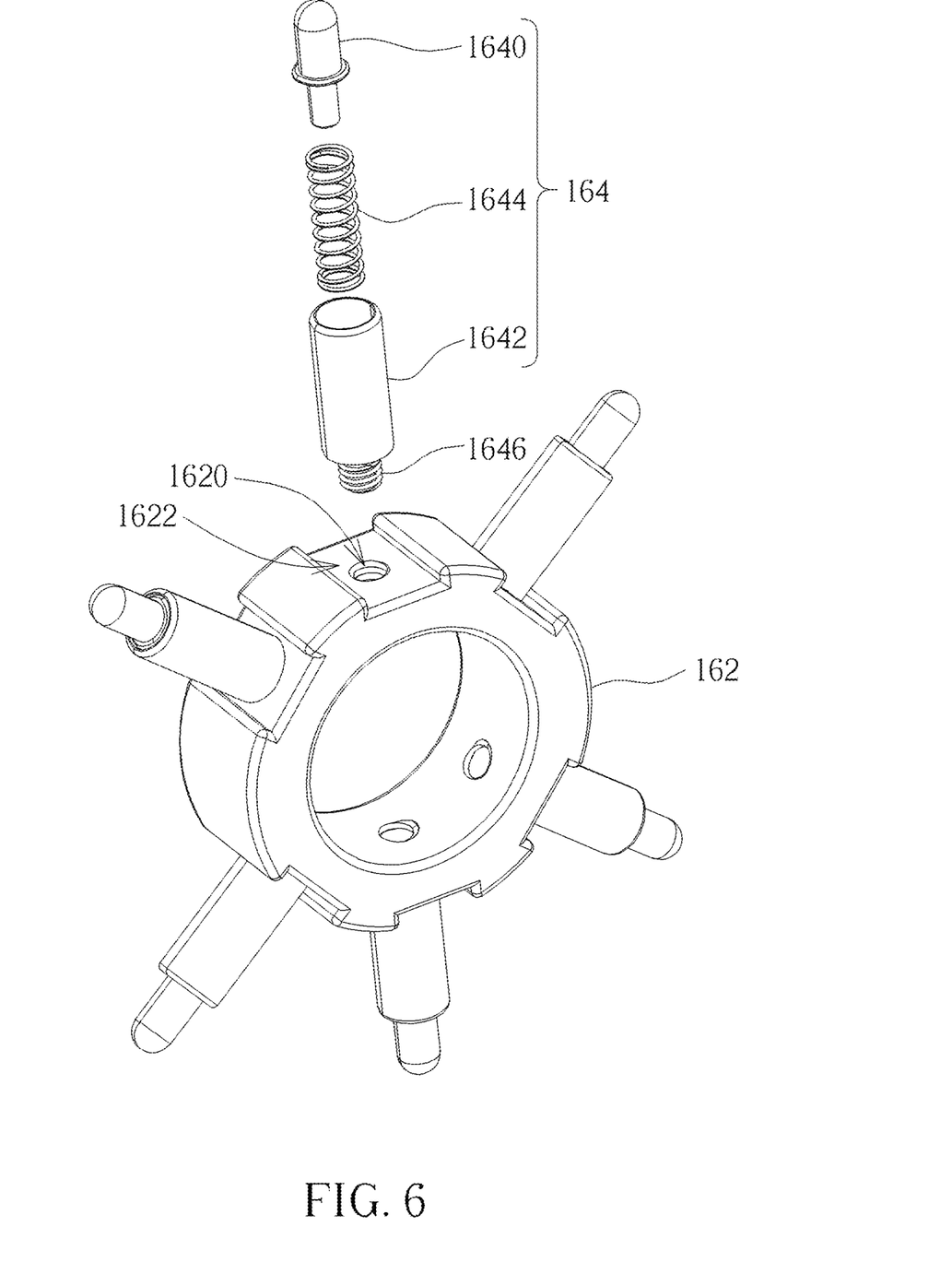
FIG. 6 is a partial exploded view illustrating a floating component and an elastic component shown in FIG. 3.
Figure 7:
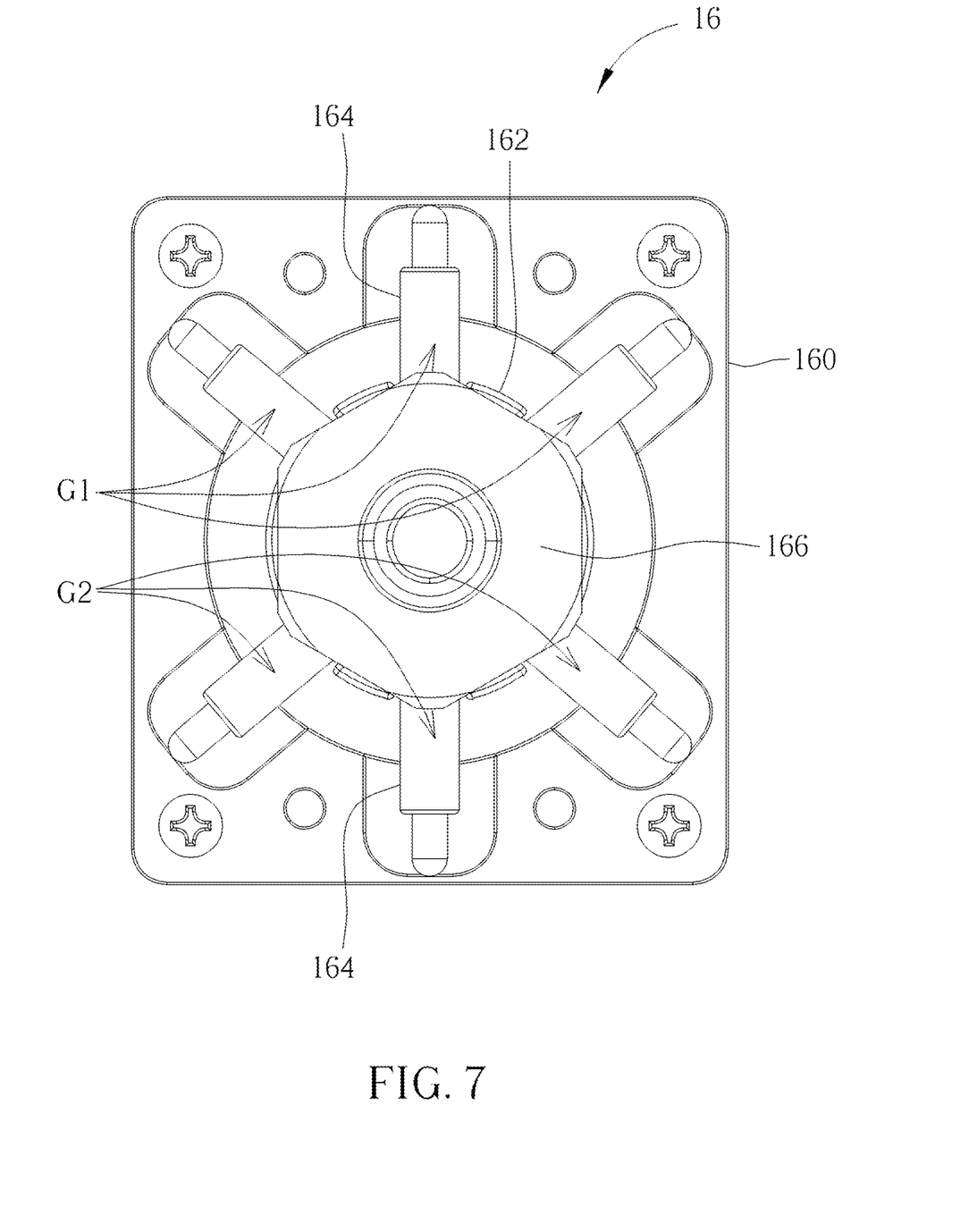
FIG. 7 is a front perspective view illustrating the pipeline connecting module shown in FIG. 2.
Figure 8:
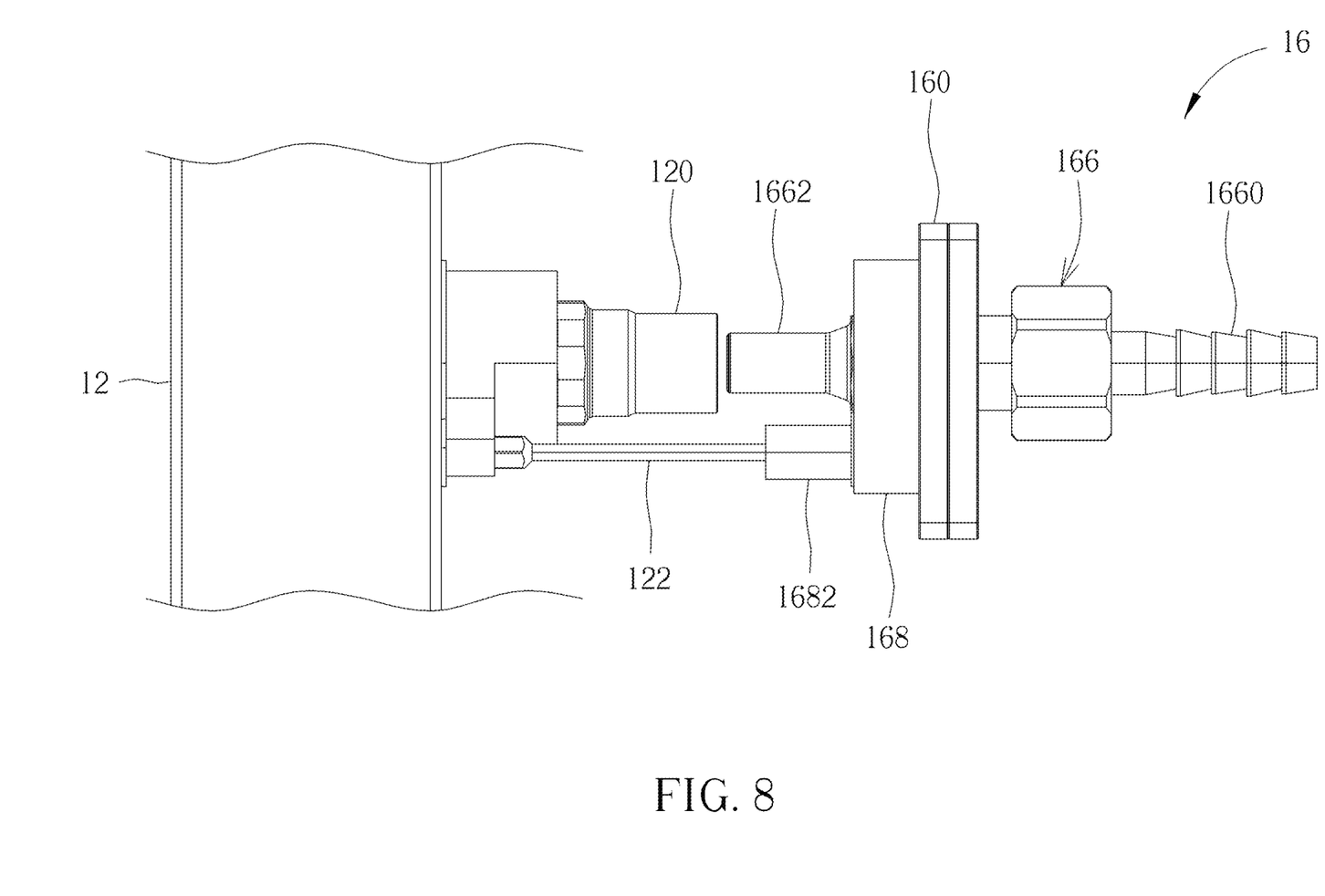
FIG. 8 is a side view illustrating a guide pin inserted into a guiding hole shown in FIG. 2.
Figure 9:
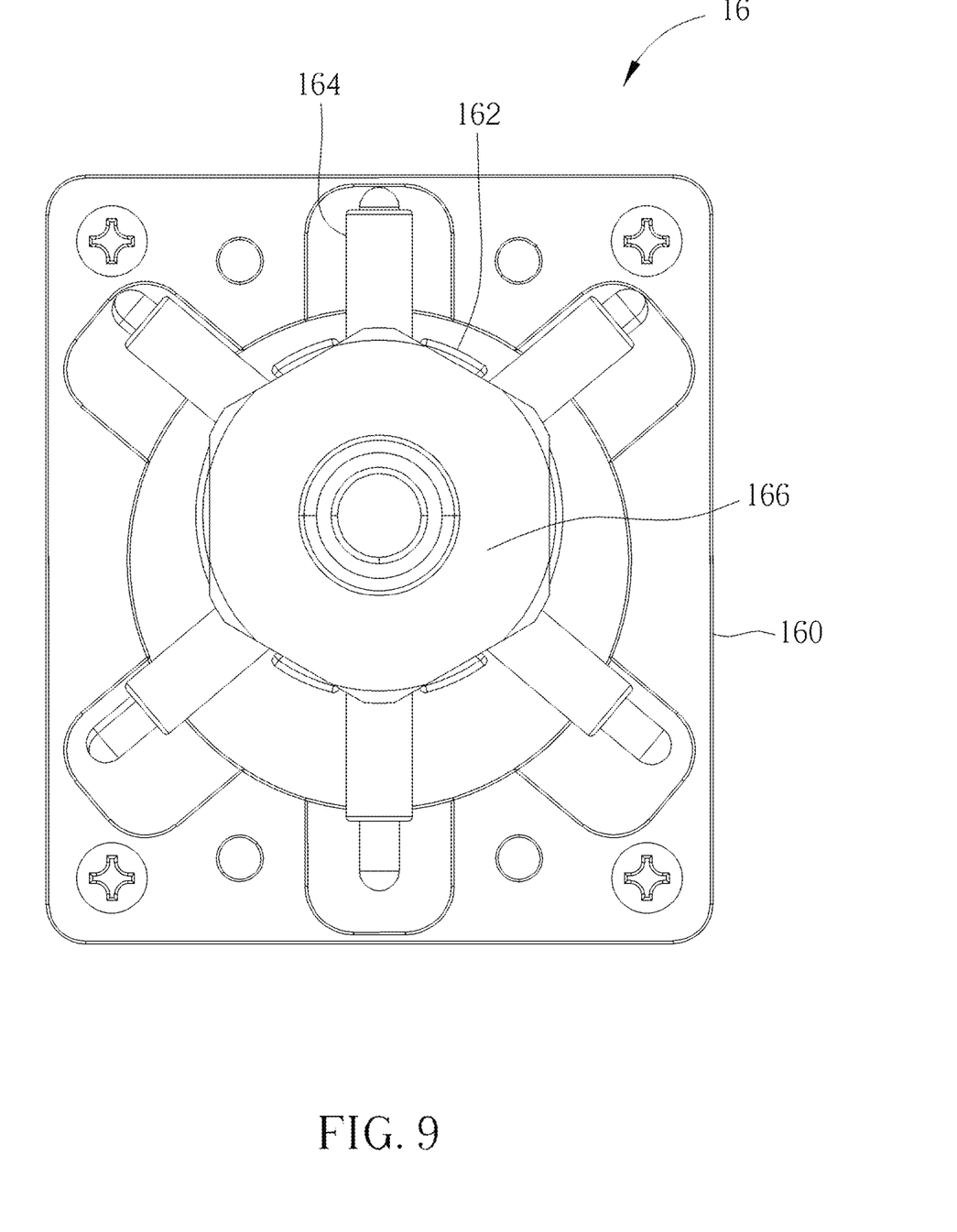
FIG. 9 is a front perspective view illustrating the pipeline connecting module shown in FIG. 8.

Referring to FIGS. 1 to 9, FIG. 1 is a schematic view illustrating a liquid cooling system 1 according to an embodiment of the invention, FIG. 2 is a partial exploded view illustrating a pipeline bracket 12 and a pipeline connecting module 16 shown in FIG. 1, FIG. 3 is an exploded view illustrating the pipeline connecting module 16 shown in FIG. 2, FIG. 4 is a perspective view illustrating the pipeline connecting module 16 shown in FIG. 2 from another viewing angle, FIG. 5 is an exploded view illustrating the pipeline connecting module 16 shown in FIG. 4, FIG. 6 is a partial exploded view illustrating a floating component 162 and an elastic component 164 shown in FIG. 3, FIG. 7 is a front perspective view illustrating the pipeline connecting module 16 shown in FIG. 2, FIG. 8 is a side view illustrating a guide pin 122 inserted into a guiding hole 1682 shown in FIG. 2, and FIG. 9 is a front perspective view illustrating the pipeline connecting module 16 shown in FIG. 8.

As shown in FIG. 1, the liquid cooling system 1 comprises a rack 10, a pipeline bracket 12, an electronic device 14 and a pipeline connecting module 16. The electronic device 14 is disposed in the rack 10 and may be a computer, a server or other electronic devices according to practical applications. It should be noted that the number of the electronic devices 14 and the pipeline connecting modules 16 may be determined according to practical applications, so the invention is not limited to the embodiment shown in the figure.

The pipeline bracket 12 is disposed in the rack 10. The pipeline bracket 12 has a manifold socket 120 and at least one guide pin 122. In this embodiment, the pipeline bracket 12 may have a plurality of manifold sockets 120 spaced apart from each other, but the invention is not so limited. The number of the manifold sockets 120 may be determined according to the number of the electronic devices 14 that the rack 10 may accommodate. Furthermore, the invention may dispose two guide pins 122 below each manifold socket 120. Still further, the pipeline bracket 12 may be connected to a cooling tank, a cooling distribution unit (CDU) and/or other liquid cooling components according practical applications.

The pipeline connecting module 16 is disposed on the electronic device 14. As shown in FIGS. 2 to 5, the pipeline connecting module 16 comprises a base 160, a floating component 162, a plurality of elastic components 164, a pipeline connecting component 166 and a guiding component 168. The base 160 has an accommodating hole 1600 and a plurality of accommodating grooves 1602, wherein the accommodating grooves 1602 communicates with the accommodating hole 1600. In this embodiment, the base 160 may consist of two plate components 160a, 160b, wherein the two plate components 160a, 160b may be fixed with each other by a plurality of fasteners 170, such that the floating component 162 is stably clamped between the two plate components 160a, 160b. It should be noted that the fixing manner between the two plate components 160a, 160b may be determined according to practical applications, so the invention is not limited to the embodiment shown in the figure.

The floating component 162 is floatingly disposed in the accommodating hole 1600 of the base 160. In this embodiment, the floating component 162 may be a ring-shaped structure. As shown in FIG. 6, a periphery of the floating component 162 may have a plurality of fixing holes 1620 and a plurality of concave portions 1622, wherein each of the fixing holes 1620 is located in one of the concave portions 1622. It should be noted that, in another embodiment, the concave portions 1622 may also be omitted. When the floating component 162 is disposed in the accommodating hole 1600 of the base 160, the positions of the fixing holes 1620 correspond to the positions of the accommodating grooves 1602.

In this embodiment, each of the elastic components 164 may comprise a plunger 1640, a barrel 1642 and a spring 1644. The spring 1644 is disposed in the barrel 1642. The plunger 1640 is disposed at an end of the barrel 1642 and abuts against the spring 1644. Accordingly, the elastic deformation direction of the spring 1644 may be consistent with the direction of force, thereby preventing the spring 1644 from irregular twisting and deformation, so as to effectively increase the number of uses of the elastic component 164. Furthermore, the barrel 1642 of each of the elastic components 164 is fixed to one of the fixing holes 1620, and the plunger 1640 of each of the elastic components 164 extends into one of the accommodating grooves 1602, such that the elastic components 164 are disposed at the periphery of the floating component 162 and abut against the base 160. Moreover, the elastic component 164 is located in the concave portion 1622, so as to increase the elastic deformation space between the elastic component 164 and the accommodating groove 1602 through the concave portion 1622. In other words, the floating component 162 is floatingly disposed in the accommodating hole 1600 of the base 160 by the elastic components 164 at the periphery of the floating component 162.

In this embodiment, the elastic components 164 are radially disposed at the periphery of the floating component 162, such that the floating component 162 may move in any direction. It should be noted that the shape, size, number and position of the elastic components 164 may be determined according to practical applications, so the invention is not limited to the embodiment shown in the figure. Furthermore, the number and position of the fixing holes 1620 and the accommodating grooves 1602 are determined according to the number and position of the elastic components 164. In this embodiment, the fixing holes 1620 may be screw holes and an end of the barrel 1642 of each elastic component 164 may have an external thread 1646, such that the barrel 1642 of each elastic component 164 may be fixed to one of the fixing holes 1620 by the external thread 1646. In other words, the elastic component 164 is detachably disposed at the periphery of the floating component 162, but the fixing manner between the fixing hole 1620 and the elastic component 164 is not so limited. In another embodiment, the barrel 1642 of the elastic component 164 may also be formed integrally with the floating component 162. At this time, the external thread 1646 and the fixing hole 1620 may be omitted.

The pipeline connecting component 166 passes through the floating component 162. In this embodiment, the pipeline connecting component 166 may comprise a first pipeline connector 1660 and a second pipeline connector 1662, wherein the first pipeline connector 1660 and the second pipeline connector 1662 are connected with each other. The floating component 162 may be sleeved on the first pipeline connector 1660. Thus, the pipeline connecting component 166 may drive the floating component 162 to move with respect to the base 160 in any direction. The first pipeline connector 1660 may be connected with a pipeline inside the electronic device 14 to transmit a coolant to the electronic device 14 for heat dissipation. Furthermore, the guiding component 168 may be sleeved on the second pipeline connector 1662. In this embodiment, the guiding component 168 may have an irregular hole 1680 and the second pipeline connector 1662 may have an irregular structure 1664. Thus, the guiding component 168 may be sleeved on the irregular structure 1664 by the irregular hole 1680, such that the irregular hole 1680 cooperates with the irregular structure 1664 to restrain the guiding component 168 from rotating with respect to the second pipeline connector 1662. Still further, the guiding component 168 may have at least one guiding hole 1682. In this embodiment, the guiding component 168 may have two guiding holes 1682, wherein the positions of the two guiding holes 1682 correspond to the positions of the two guide pins 122 below each manifold socket 120 of the pipeline bracket 12.

As shown in FIG. 1, the electronic device 14 may be disposed in the rack 10 and the pipeline connecting component 166 of the pipeline connecting module 16 may be connected to the manifold socket 120 of the pipeline bracket 12, such that the coolant may be exchanged between the electronic device 14 and the pipeline bracket 12. As shown in FIGS. 2 and 7, before the pipeline connecting module 16 is assembled to the pipeline bracket 12, the elastic components 164 support the floating component 162 at the center of the accommodating hole 1600 of the base 160.

In practical applications, the pipeline connecting module 16 and the pipeline bracket 12 may have assembly and/or manufacturing tolerances, which may easily cause the pipeline connecting component 166 and the manifold socket 120 to fail to be assembled, or even cause damage to the pipeline connecting component 166 and/or the manifold socket 120. Thus, before assembling the pipeline connecting module 16 to the pipeline bracket 12, the guide pin 122 may be inserted into the guiding hole 1682 first. As shown in FIGS. 8 and 9, when the guide pin 122 is inserted into the guiding hole 1682, the guiding component 168 will drive the pipeline connecting component 166 to move to drive the floating component 162 to move correspondingly and the elastic component 164 thus elastically deforms, such that the second pipeline connector 1662 is aligned with the manifold socket 120. As shown in FIG. 9, when the floating component 162 moves upward, the upper elastic component 164 is compressed. Then, the pipeline connecting module 16 continues to move toward the pipeline bracket 12, such that the second pipeline connector 1662 of the pipeline connecting component 166 is connected to the manifold socket 120. When the pipeline connecting module 16 is separated from the pipeline bracket 12, the compressed elastic component 164 will return the floating component 162, the pipeline connecting component 166 and the guiding component 168.

As shown in FIG. 7, the elastic components 164 may be divided into a first group G1 and a second group G2, wherein an elastic coefficient of each elastic component 164 of the first group G1 is different from an elastic coefficient of each elastic component 164 of the second group G2. Before the pipeline connecting module 16 is assembled to the pipeline bracket 12, the elastic components 164 located below need to support the weight of the floating component 162, the pipeline connecting component 166 and the guiding component 168, so as to support the floating component 162 at the center of the accommodating hole 1600 of the base 160. Thus, the elastic coefficient of each elastic component 164 of the second group G2 located below may be larger than the elastic coefficient of each elastic component 164 of the first group G1 located above. Accordingly, the second group G2 located below may support the weight of the floating component 162, the pipeline connecting component 166 and the guiding component 168, so as to support the floating component 162 at the center of the accommodating hole 1600 of the base 160. It should be noted that the elastic coefficient of each elastic component 164 of the first group G1 may also be identical to the elastic coefficient of each elastic component 164 of the second group G2 according to practical applications.

As mentioned in the above, the floating component is floatingly disposed in the accommodating hole of the base, and the elastic components are disposed at the periphery of the floating component and abut against the base. By means of the aforesaid arrangement, the pipeline connecting module is capable of absorbing assembly and/or manufacturing tolerances during assembly, thereby preventing the connectors from failing to be assembled or even being damaged. In an embodiment, the elastic component may consist of a plunger, a barrel and a spring, so as to effectively increase the number of uses of the elastic component. Furthermore, since the elastic component is detachably disposed at the periphery of the floating component, it is helpful to replace the elastic component of different shape and size or the spring thereof according to practical applications, and it is also easy to adjust the number or position of the elastic components, such that the invention has better flexibility and applicability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pipeline connecting module comprising:
a base having an accommodating hole;
a floating component floatingly disposed in the accommodating hole;
a plurality of elastic components disposed at a periphery of the floating component and abutting against the base, the plurality of elastic components being divided into a first group and a second group, an elastic coefficient of each elastic component of the first group being different from an elastic coefficient of each elastic component of the second group; and
a pipeline connecting component passing through the floating component.

2. The pipeline connecting module of claim 1, wherein each of the plurality of elastic components is detachably disposed at the periphery of the floating component.

3. The pipeline connecting module of claim 1, wherein each of the plurality of elastic components comprises a plunger, a barrel and a spring, the spring is disposed in the barrel, and the plunger is disposed at an end of the barrel and abuts against the spring.

4. The pipeline connecting module of claim 3, wherein the periphery of the floating component has a plurality of fixing holes, the base has a plurality of accommodating grooves, the plurality of accommodating grooves communicate with the accommodating hole, positions of the plurality of fixing holes correspond to positions of the plurality of accommodating grooves, the barrel of each of the plurality of elastic components is fixed to one of the plurality of fixing holes, and the plunger of each of the plurality of elastic components extends into one of the plurality of accommodating grooves.

5. The pipeline connecting module of claim 4, wherein the periphery of the floating component has a plurality of concave portions, and each of the plurality of fixing holes is located in one of the plurality of concave portions.

6. The pipeline connecting module of claim 1, wherein the plurality of elastic components are radially disposed at the periphery of the floating component.

7. The pipeline connecting module of claim 1, wherein the pipeline connecting component comprises a first pipeline connector and a second pipeline connector, the first pipeline connector and the second pipeline connector are connected with each other, and the floating component is sleeved on the first pipeline connector.

8. The pipeline connecting module of claim 7, further comprising a guiding component sleeved on the second pipeline connector, wherein the guiding component has at least one guiding hole.

9. The pipeline connecting module of claim 8, wherein the guiding component has an irregular hole, the second pipeline connector has an irregular structure, the guiding component is sleeved on the irregular structure by the irregular hole, and the irregular hole cooperates with the irregular structure to restrain the guiding component from rotating with respect to the second pipeline connector.

10. A liquid cooling system comprising:
a rack;
a pipeline bracket disposed in the rack, the pipeline bracket having a manifold socket;
an electronic device disposed in the rack; and
a pipeline connecting module disposed on the electronic device, the pipeline connecting module comprising:
a base having an accommodating hole;
a floating component floatingly disposed in the accommodating hole;
a plurality of elastic components disposed at a periphery of the floating component and abutting against the base, the plurality of elastic components being divided into a first group and a second group, an elastic coefficient of each elastic component of the first group being different from an elastic coefficient of each elastic component of the second group; and
a pipeline connecting component passing through the floating component, the pipeline connecting component being connected to the manifold socket.

11. The liquid cooling system of claim 10, wherein each of the plurality of elastic components is detachably disposed at the periphery of the floating component.

12. The liquid cooling system of claim 10, wherein each of the plurality of elastic components comprises a plunger, a barrel and a spring, the spring is disposed in the barrel, and the plunger is disposed at an end of the barrel and abuts against the spring.

13. The liquid cooling system of claim 12, wherein the periphery of the floating component has a plurality of fixing holes, the base has a plurality of accommodating grooves, the plurality of accommodating grooves communicate with the accommodating hole, positions of the plurality of fixing holes correspond to positions of the plurality of accommodating grooves, the barrel of each of the plurality of elastic components is fixed to one of the plurality of fixing holes, and the plunger of each of the plurality of elastic components extends into one of the plurality of accommodating grooves.

14. The liquid cooling system of claim 13, wherein the periphery of the floating component has a plurality of concave portions, and each of the plurality of fixing holes is located in one of the plurality of concave portions.

15. The liquid cooling system of claim 10, wherein the plurality of elastic components are radially disposed at the periphery of the floating component.

16. The liquid cooling system of claim 10, wherein the pipeline connecting component comprises a first pipeline connector and a second pipeline connector, the first pipeline connector and the second pipeline connector are connected with each other, and the floating component is sleeved on the first pipeline connector.

17. The liquid cooling system of claim 16, wherein the pipeline connecting module further comprises a guiding component sleeved on the second pipeline connector, the guiding component has at least one guiding hole, and the pipeline bracket further has at least one guide pin; wherein, when the at least one guide pin is inserted into the at least one guiding hole, the guiding component drives the floating component to move by the pipeline connecting component, so as to align the second pipeline connector with the manifold socket.

18. The liquid cooling system of claim 17, wherein the guiding component has an irregular hole, the second pipeline connector has an irregular structure, the guiding component is sleeved on the irregular structure by the irregular hole, and the irregular hole cooperates with the irregular structure to restrain the guiding component from rotating with respect to the second pipeline connector.

* * * * *